United States Patent
Ryu et al.

(10) Patent No.: US 7,498,679 B2
(45) Date of Patent: Mar. 3, 2009

(54) PACKAGE SUBSTRATE AND SEMICONDUCTOR PACKAGE USING THE SAME

(75) Inventors: Jung-Seok Ryu, Chungcheongnam-do (KR); Pyoung-Wan Kim, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/354,469

(22) Filed: Feb. 14, 2006

(65) Prior Publication Data

US 2007/0013039 A1 Jan. 18, 2007

(30) Foreign Application Priority Data

Jul. 18, 2005 (KR) ........................ 10-2005-0064949

(51) Int. Cl.
*H01L 23/52* (2006.01)
*H01L 23/48* (2006.01)
*H01L 23/40* (2006.01)
*H01L 23/495* (2006.01)
*H01L 21/50* (2006.01)
*H01L 21/48* (2006.01)
*H01L 21/44* (2006.01)

(52) U.S. Cl. ........................ 257/782; 257/783; 257/786; 257/E23.04; 438/118

(58) Field of Classification Search ................ 257/787, 257/782, 783, 786, E23.04; 438/118
See application file for complete search history.

(56) References Cited

U.S. PATENT DOCUMENTS 5,218,234 A * 6/1993 Thompson et al. .......... 257/787
5,262,927 A * 11/1993 Chia et al. .................. 361/784
6,218,731 B1 * 4/2001 Huang et al. ................ 257/738
6,333,564 B1 * 12/2001 Katoh et al. ................ 257/780
6,342,728 B2 * 1/2002 Miyazaki et al. ............ 257/668
6,385,049 B1 * 5/2002 Chia-Yu et al. ............. 361/721
6,462,274 B1 * 10/2002 Shim et al. .................. 174/535
6,521,980 B1 * 2/2003 Tandy et al. ................ 257/668
6,531,335 B1 * 3/2003 Grigg ......................... 438/106
6,781,066 B2 * 8/2004 Heng ......................... 174/260
6,870,274 B2 * 3/2005 Huang ........................ 257/780
7,262,499 B2 * 8/2007 Kheng ........................ 257/738

FOREIGN PATENT DOCUMENTS

| JP | 7-45641 | 2/1995 |
| KR | 1999-025705 | 4/1999 |
| KR | 10-0233861 | 9/1999 |
| KR | 10-0369397 | 1/2003 |

OTHER PUBLICATIONS

English language abstract of Korean Publication No. 1999-025705.
English language abstract of Korean Publication No. 10-0369397.
English language abstract of Japanese Publication No. 7-45641.

* cited by examiner

*Primary Examiner*—Luan C Thai
(74) *Attorney, Agent, or Firm*—Marger Johnson & McCollom, P.C.

(57) ABSTRACT

A package substrate may have an improved surface structure for controlling the flow of an adhesive. The package substrate may have an upper surface and a lower surface covered with a passivation layer. A window may be provided in, for example, the center of the package substrate. Sinks may be provided on the lower surface, clear of the passivation layer. The semiconductor package may have an indented or non-planar surface structure.

6 Claims, 11 Drawing Sheets

US 7,498,679 B2

PACKAGE SUBSTRATE AND SEMICONDUCTOR PACKAGE USING THE SAME

CROSS REFERENCE TO RELATED APPLICATIONS

This U.S. non-provisional application claims benefit of priority under 35 U.S.C. §119 of Korean Patent Application No. 2005-64949, filed on Jul. 18, 2005, the entire contents of which are incorporated herein by reference.

BACKGROUND OF THE INVENTION

1. Field of the Invention

The present invention relates to a semiconductor packaging technique.

2. Description of the Related Art

A semiconductor package contains a semiconductor chip and presents external connections for interacting with the semiconductor chip. Semiconductor packages in their infancy used lead frames in connecting a semiconductor chip to an external system. The lead frames may include portions connected with the external system, for example outer leads, which may be arranged linearly, e.g., in a line or one-dimensionally, along the edges of a package. As the number of I/O pins and the operation speed of the semiconductor chips increased, however, semiconductor packages increasingly used printed circuit boards (PCBs) in place of the lead frames. The PCBs may have external connection terminals, for example solder balls, which may be arranged on a surface, e.g., two-dimensionally across the surface. The PCBs may meet the demand for the increased number of I/O pins and operation speed of a semiconductor chip.

Recently, board-on-chip (BOC) packages have been introduced. The BOC package may include a PCB provided on a chip having I/O pads. The BOC package may have a reduced electrical connection route between a chip and a substrate.

An adhesive may be used in attaching the PCB to the chip. The adhesive may include a film type and a liquid type. A liquid adhesive, having a predetermined viscosity, may be applied to the PCB using a screen-printing method.

FIG. 1 is a cross-sectional view of a conventional chip attachment process using an adhesive. Referring to FIG. 1, a semiconductor chip 10 may be placed on a stage 40. A head 50 may press down a PCB 20. The semiconductor chip 10 may be connected to the PCB 20, e.g., under a high temperature applied by the stage 40 and the head 50 and by a pressing force of the head 50 to cure the adhesive 30.

During a chip attachment process, faults may occur due to various causes. FIGS. 2A through 2E are cross-sectional views of some conventional faults caused by an abnormal flow of the adhesive 30.

For example, the faults related to the adhesive 30 may result from overflow of the adhesive 30 as shown in FIGS. 2A and 2B, or nonflow of the adhesive 30 as shown in FIGS. 2D and 2E.

Referring to FIG. 2A, the adhesive 30 may overflow 31 and run to the side surface of the PCB 20, thereby contaminating the lead patterns 21 of the PCB 20 or the head 50. Referring to FIG. 2B, the adhesive overflow 32 may invade the I/O pads 11 of the semiconductor chip 10, thereby contaminating the I/O pads 11. The contamination of the lead patterns 21 of the PCB 20 and/or the I/O pads 11 of the semiconductor chip 10 may unfavorably influence a subsequent wire bonding process. Referring to FIG. 2C, an adhesive residue 33 may unfavorably influence, e.g., cause distortion or misalignment during, a chip attachment process, thereby resulting in an excess attachment 34 and/or an incomplete attachment 35.

Referring to FIG. 2D, the adhesive 30 may flow incompletely and be cured in such condition to create a gap 36 between the semiconductor chip 10 and the PCB 20. During a subsequent encapsulation process, a filler 61 of a molding compound 60 may undesirably flow into the gap 36, thereby damaging a passivation layer 12 of the semiconductor chip 10. Referring to FIG. 2E, an incomplete flow of the adhesive 30 may cause a void 37 between the adhesive 30 and the PCB 20. The void 37 may induce swelling 38 of the PCB 20 during subsequent processes, e.g. such as during application of heat energy.

As described above, it is difficult to control the flow of the adhesive 30 during a chip attachment process. An abnormal flow of the adhesive 30 may result from a nonuniform application of the adhesive 30, an uneven pressing of the head 50 downward on the PCB 20, an excessive curing speed of the adhesive 30, and so on.

SUMMARY

An example embodiment of the present invention is directed to controlling the flow of an adhesive when attaching a semiconductor chip to a package substrate, thereby reducing faults related to the adhesive. Non-planar surface features of the package substrate accommodate adhesive flow and thereby reduce the likelihood of undesirable adhesive overflow and underflow conditions. Example embodiments of the present invention thereby improve the process margin or success rate of joining by adhesive a package substrate and a semiconductor chip.

BRIEF DESCRIPTION OF THE DRAWINGS

The example embodiments of the present invention will be readily understood with reference to the following detailed description thereof provided in conjunction with the accompanying drawings, wherein like reference numerals designate like structural elements.

Figure 1:
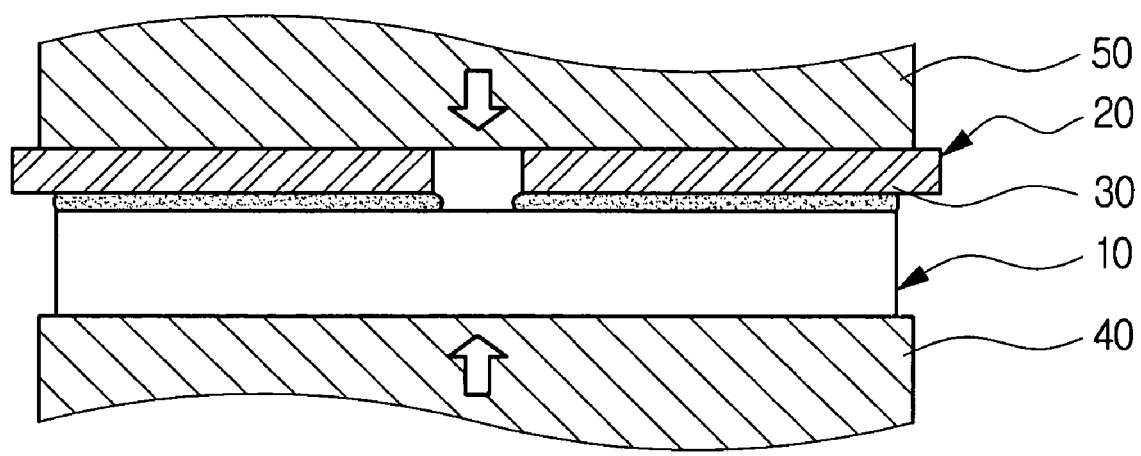
FIG. 1 (Prior Art) is a cross-sectional view of a conventional chip attachment process using an adhesive.
Figure 2A:
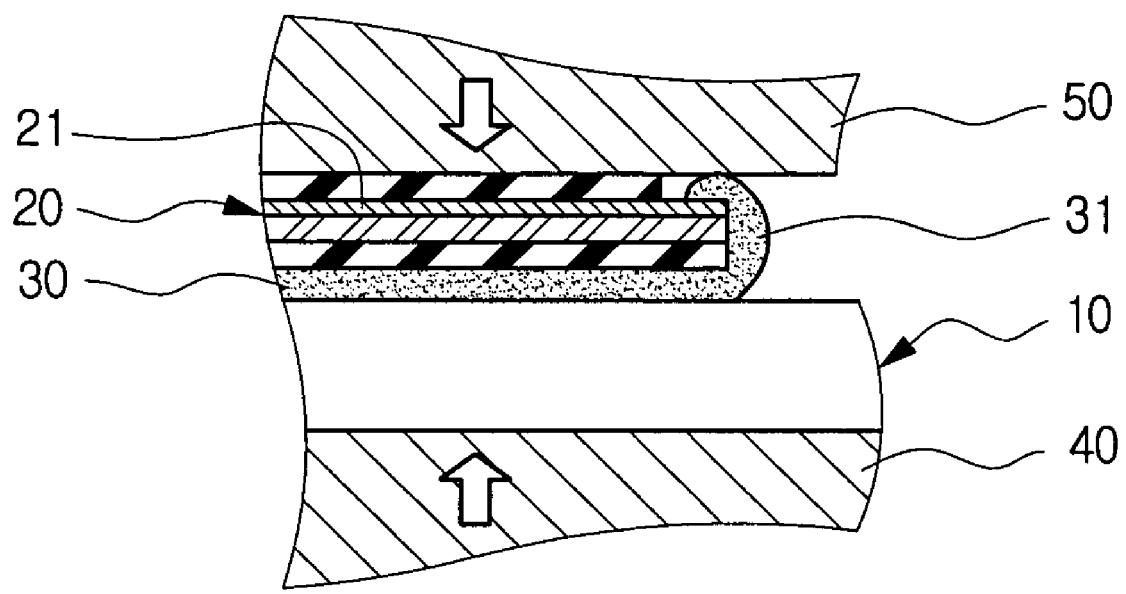
FIGS. 2A through 2E (Prior Art) are cross-sectional views of conventional faults caused by an abnormal flow of an adhesive.
Figure 2B:
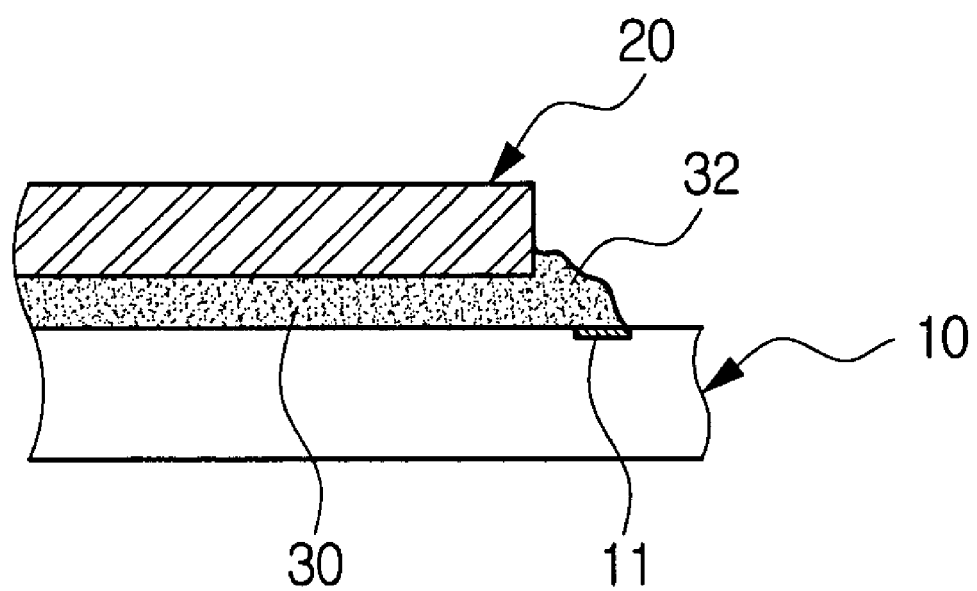
Figure 2C:
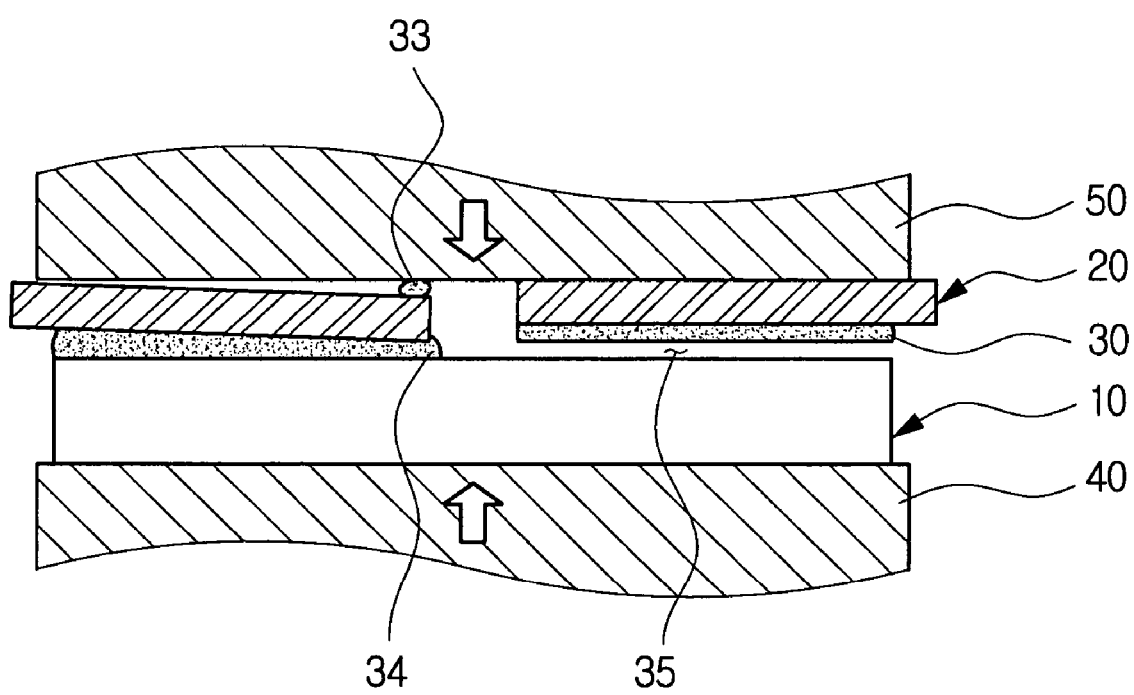
Figure 2D:
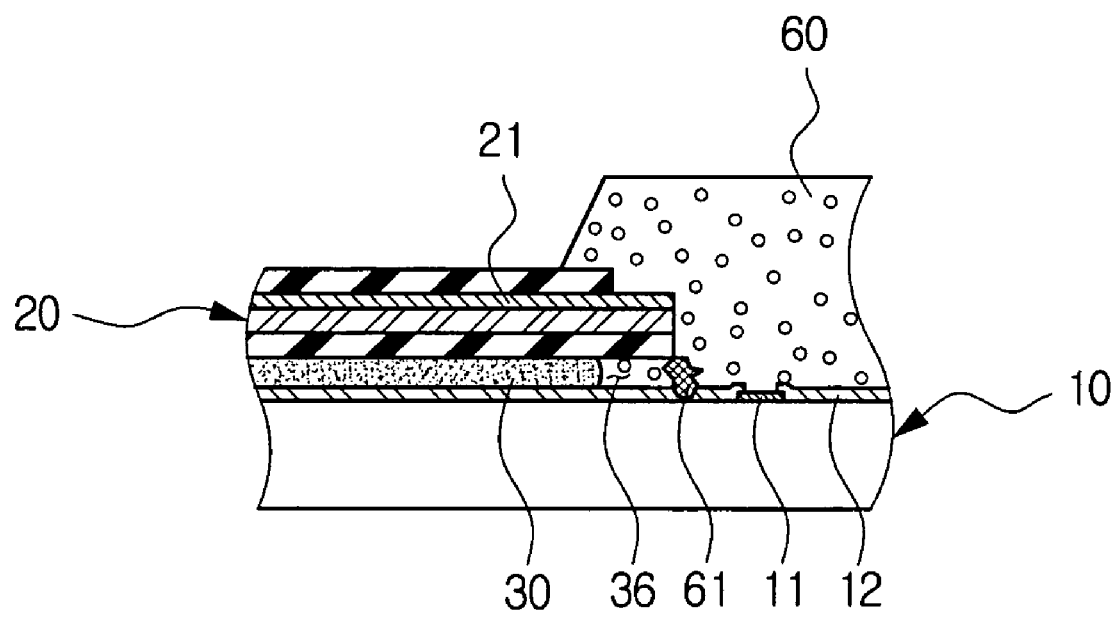
Figure 2E:
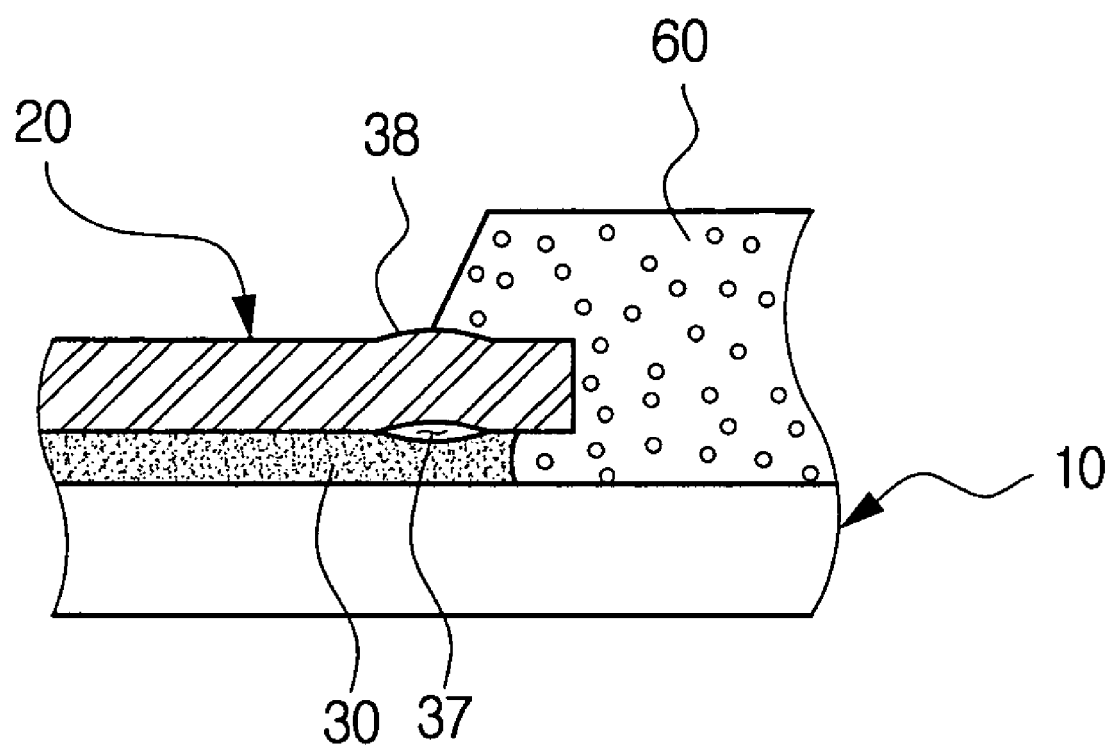

These drawings are for illustrative purposes only and are not drawn to scale. The spatial relationships and relative sizing of the elements illustrated in the various embodiments may have been reduced, expanded or rearranged to improve the clarity of the figures with respect to the corresponding description. The figures, therefore, should not be interpreted as accurately reflecting the relative sizing or positioning of the corresponding structural elements that could be encompassed by an actual device manufactured according to the example embodiments of the invention.

DETAILED DESCRIPTION

Example, non-limiting embodiments of the present invention will now be described more fully hereinafter with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

It should be noted that the figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention. Rather, for simplicity and clarity of illustration, the dimensions of some of the elements are exaggerated relative to other elements.

Further, well-known structures and processes are not described or illustrated in detail to avoid obscuring the present invention. Like reference numerals are used for like and corresponding parts of the various drawings.

Figure 3:
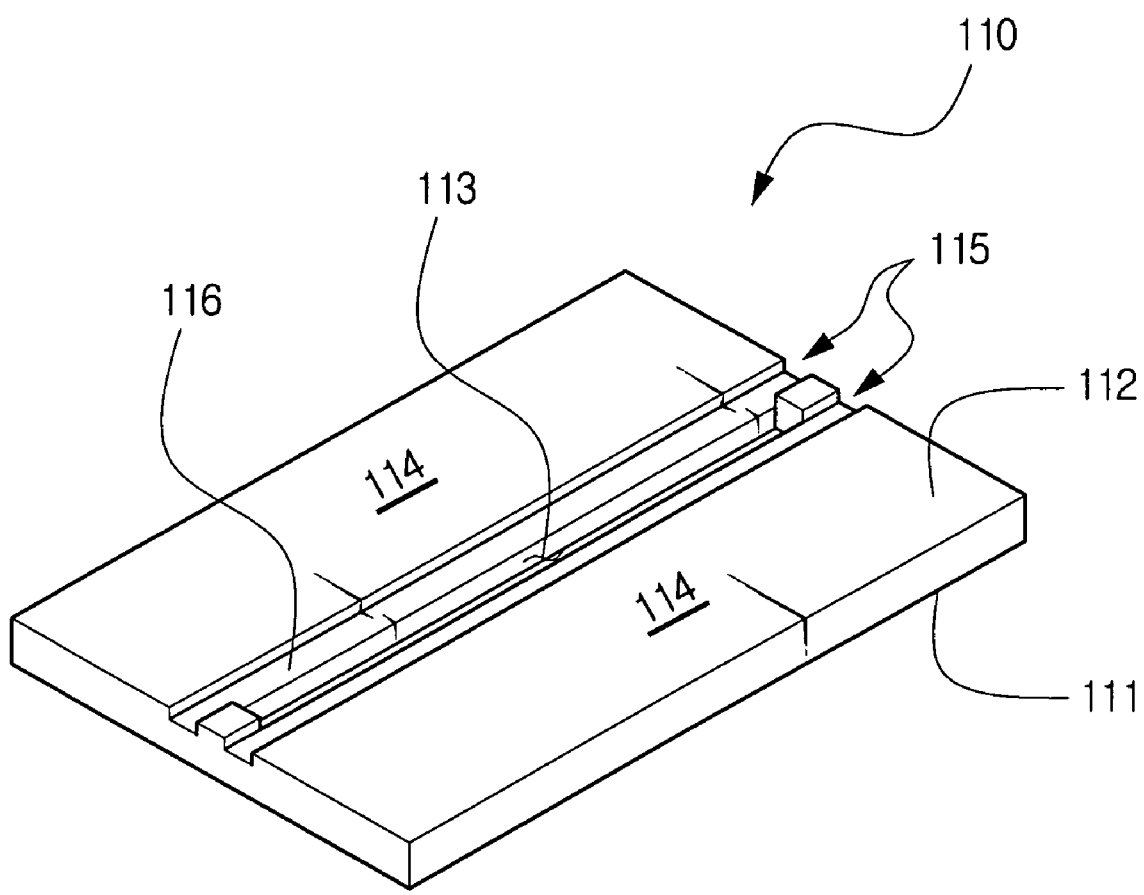
FIG. 3 is a perspective view of a surface structure of a package substrate in accordance with an example embodiment of the present invention.

FIG. 3 is a perspective view of a surface structure of a package substrate 110 in accordance with an example embodiment of the present invention.

Referring to FIG. 3, the package substrate 110 may have an upper surface 111, a lower surface 112, and an insulating layer 116. A window 113 may be formed through, e.g., along the center of, the package substrate 110. A pair of sinks 115 may be formed on each side of, e.g., contiguous with, the window 113. A passivation layer 114 may cover the upper surface 111 and the lower surface 112, except for the sinks 115.

The insulating layer 116 may be exposed through the sinks 115. In this particular example, the sinks 115 may be arranged adjacent to the window 113. The length of each sink 115 may be substantially similar to that of the longer side of the lower surface 112 of the package substrate 110. The sinks 115 may be formed by removing a portion of the passivation layer 114 using an etching process, or by changing a mask design during forming of the passivation layer 114.

The surface structure of the package substrate 110, in accordance with embodiments of the present invention, may be characterized by the sinks 115 providing controlled flow of an adhesive during a chip attachment process.

Figure 4:
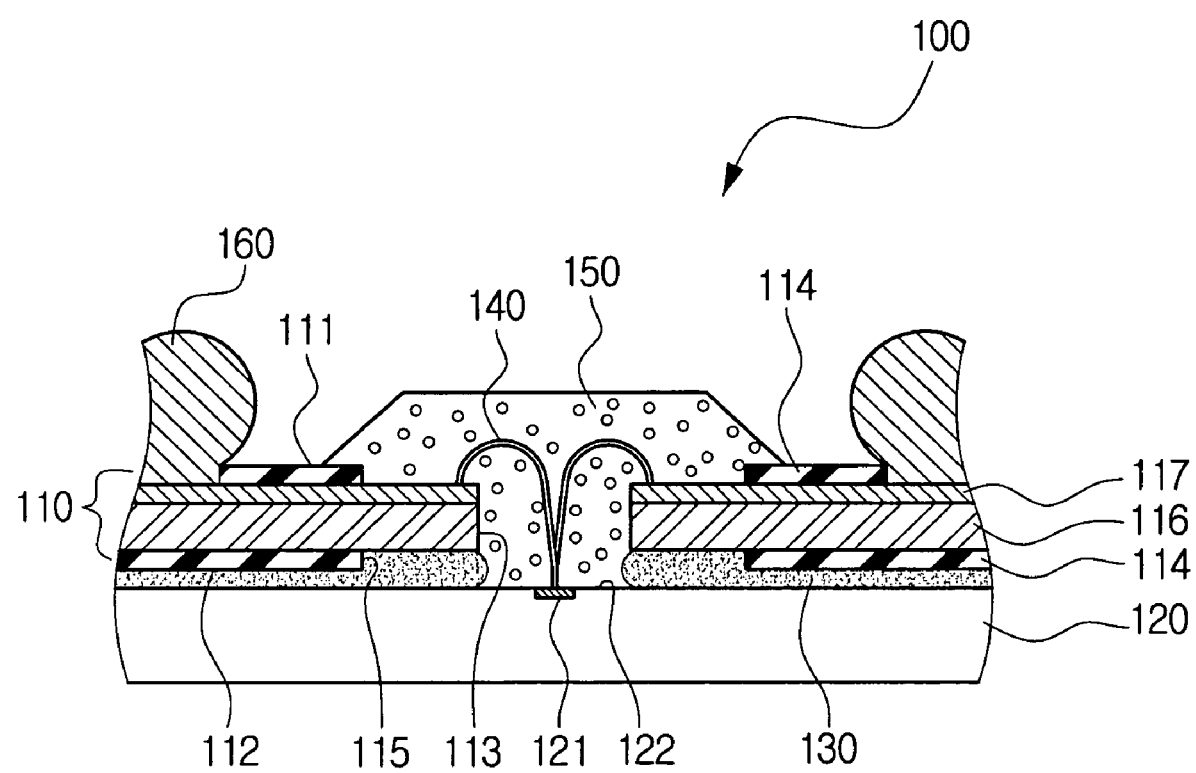
FIG. 4 is a cross-sectional view of a semiconductor package using the package substrate of FIG. 3.

FIG. 4 is a cross-sectional view of a semiconductor package 100 using the package substrate 110 of FIG. 3.

Referring to FIG. 4, the semiconductor package 100 may include the package substrate 110, a semiconductor chip 120, an adhesive 130, conductive wires 140, a molding compound 150, and external connection terminals 160.

The package substrate 110 may be a PCB, for example. Lead patterns 117 may be provided on one surface of the insulating layer 116. The insulating layer 116 may be formed of a flame retardant epoxy resin, for example FR-4. The lead patterns 117 may include, for example, copper wiring patterns, and the passivation layer 114 may be formed of, for example, a photo solder resist.

The semiconductor chip 120 may include, for example, a DRAM memory chip, and have an active surface 122. I/O pads 121 may be provided, for example, along the center of the active surface 122. A window 113 may be formed, for example, along the center of the package substrate 110 to electrically connect the I/O pads 121 of the semiconductor chip 120 to the lead patterns 117 of the package substrate 110. Thus, the window 113 provides a wire routing formation corresponding to, e.g., positioned in relation to, the I/O pads 121 of the semiconductor chip 120 and allowing electrical connection, e.g., by way of bonding wires 140, between the semiconductor chip 120 and the substrate 110. In this particular example embodiment, the I/O pads 121 may be exposed through the window 113 to allow placement of the conductive wires 140 therethrough.

The adhesive 130 may include a liquid adhesive formed of silicone, for example. The adhesive 130 may be applied to the lower surface 112 of the package substrate 110 using a screen-printing method. The adhesive 130 may be cured under heat and pressure by the stage (40 of FIG. 1) and the head (50 of FIG. 1). Therefore, the adhesive 130 may connect the active surface 122 of the semiconductor chip 120 to the lower surface 112 of the package substrate 110.

The conductive wires 140 may include Au wires, for example. One end of the conductive wires 140 may be connected to the I/O pads 121 of the semiconductor chip 120 and the other end of the conductive wires 140 may be connected to the lead patterns 117 of the package substrate 110. The conductive wires 140 thereby provide an electrical connection between the semiconductor chip 120 and the package substrate 110.

The molding compound 150 may include an epoxy-molding compound, for example. The molding compound 150 may be formed in the window 113 of the package substrate 110 through a molding process or a dispensing process. The molding compound 150 may protect the I/O pads 121 and the lead patterns 117 from the external environment and fix the conductive wires 140.

The external connection terminals 160 may include solder balls, for example. Typically, the external connection terminals 160 may be provided on the lead patterns 117 of the package substrate 110. The external connection terminals 160 may provide the semiconductor package 100 with an electrical and mechanical connection to an external system (not shown).

The semiconductor package 100 according to embodiments of the present invention may be characterized by the surface structure of the package substrate 110. The package substrate 110 may have one or more of the sinks 115 formed on the lower surface 112.

The sinks 115 may increase a space for receiving the adhesive 130 to reduce the likelihood for overflow of the adhesive 130. In this example, the sinks 115 may be arranged on each side of the window 113 to reduce the likelihood that the overflow adhesive 130 may contaminate the lead patterns 117 of the package substrate 110, the head (50 of FIG. 1), and/or the I/O pads 121 of the semiconductor chip 120.

Further, formation of the sinks 115 may incorporate the indented lower surface 112 of the package substrate 110, thereby reducing the likelihood for nonflow of the adhesive 130. The nonflow of the adhesive 130 may occur when the adhesive 130 may flow incompletely and be cured. The sinks 115 may lead to a smooth flow of the adhesive 130 when the pressing force of the head may be applied. As a result, the likelihood for nonflow of the adhesive 130 may be reduced.

In other words, the non-planar surface features of the substrate, e.g., the sinks 115, by accommodating adhesive flow establish a greater difference between an underflow and an overflow condition. Adhesive flow management becomes less critical thereby making the resulting package structure less susceptible to a malformed adhesive layer.

Therefore, the surface structure of the package substrate 110 having the sinks 115 may efficiently control the flow of the adhesive 130 during a chip attachment process.

Figure 5:
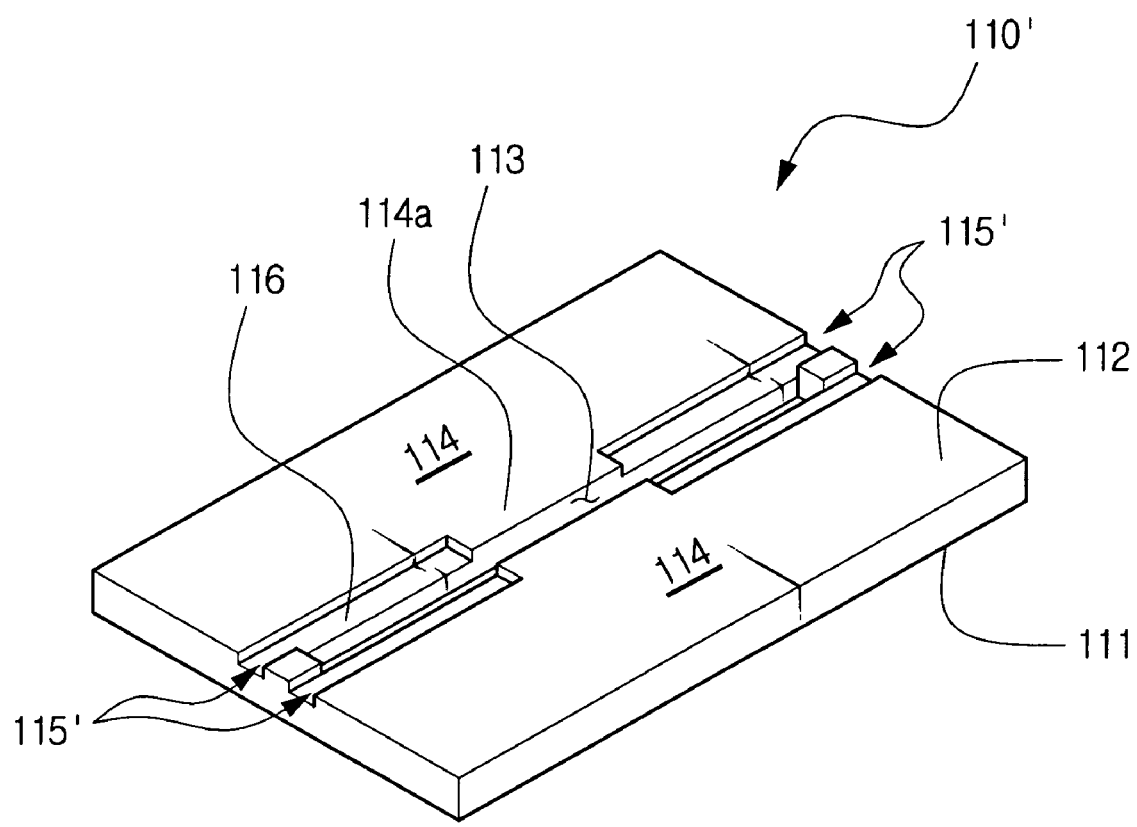
FIG. 5 is a perspective view of another example of the surface structure of the package substrate of FIG. 3.

FIG. 5 is a perspective view of another example of the surface structure of the package substrate 110 of FIG. 3.

Referring to FIG. 5, the sinks 115' may be not formed in the middle of the window 113. Therefore, two pairs of sinks 115' may be arranged on each side of the window 113. A portion of the passivation layer 114a may remain in the middle of the window 113.

In this example, the sinks 115' may be formed parallel, for example, to the longer side of the lower surface 112. The adhesive 130 may thereby flow smoothly in the direction of the longer side. In this case, the package substrate 110' may be applied to a semiconductor chip of a large capacity, e.g., having a large chip area. Alternatively, the sinks 115' may be formed parallel, for example, to the shorter side of the lower surface 112. It will be understood, however, that a variety of relative orientations of sinks 115' and reference features, e.g., sides, of the surface 112 may be provided.

Figure 6:
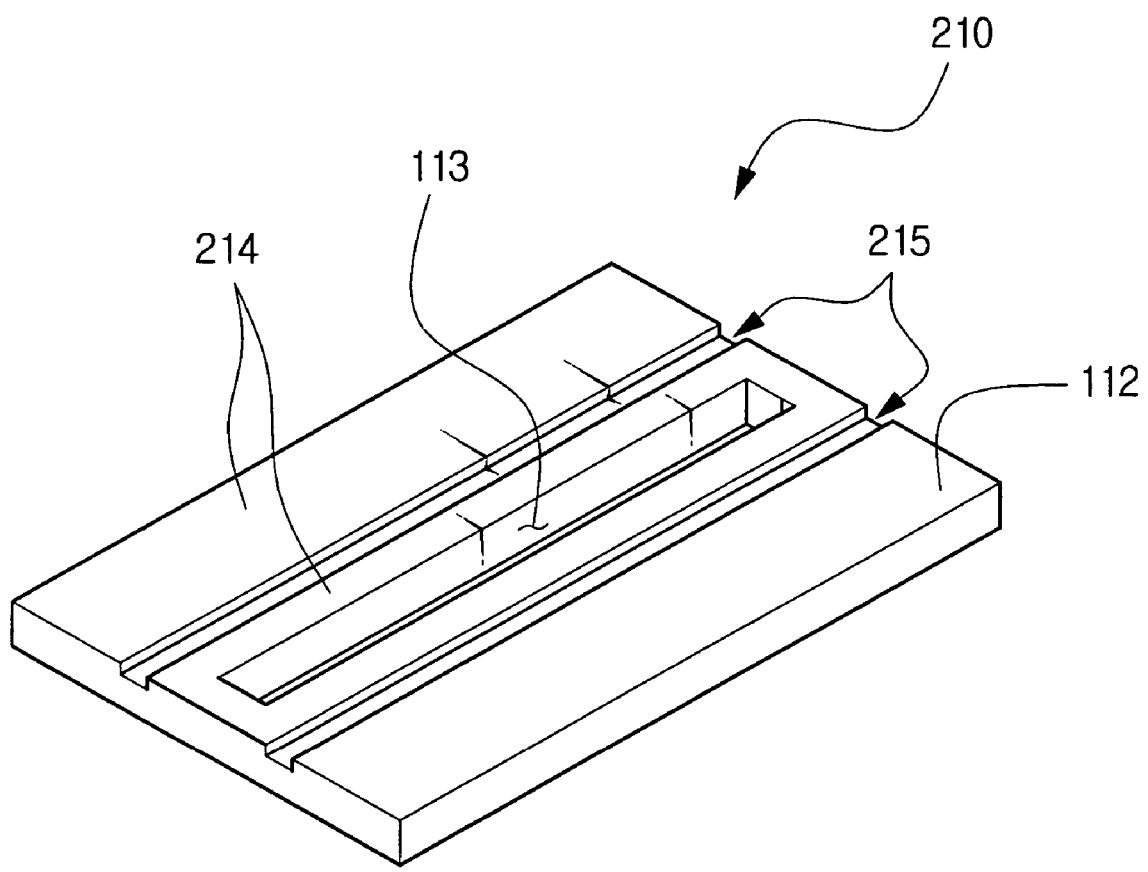
FIG. 6 is a perspective view of a surface structure of a package substrate in accordance with another example embodiment of the present invention.

FIG. 6 is a perspective view of a surface structure of a package substrate 210 in accordance with another example embodiment of the present invention.

Referring to FIG. 6, the package substrate 210 may have a substantially similar structure as the package substrate 110, except for the sink configuration. A pair of sinks 215 may be arranged spaced apart from the window 113. A passivation layer 214 may cover spaces between the sinks 215 and the window 113. The sinks 215 may be formed parallel, for example, to the longer side of the lower surface 112. Alternatively, the sinks 215 may be formed parallel, for example, to the shorter side of the lower surface 112. It will be understood, however, that a variety of relative orientations of sinks 215' and features, e.g., sides, of the surface 112 may be provided.

Figure 7:
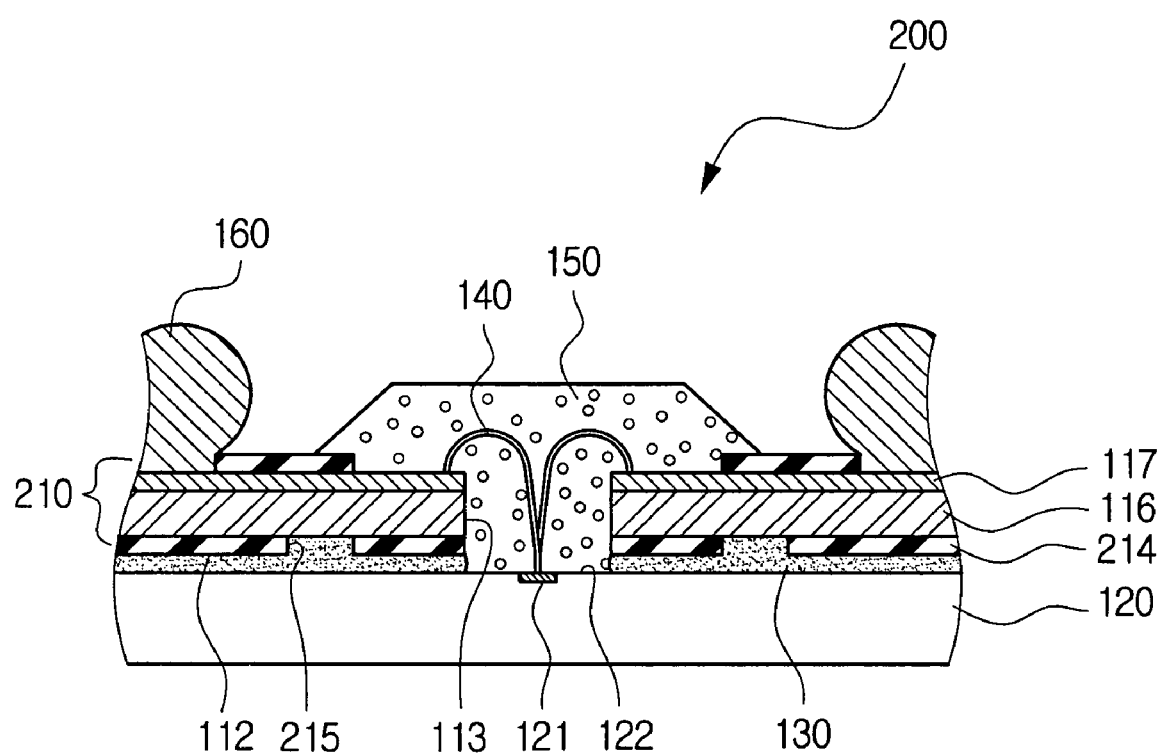
FIG. 7 is a cross-sectional view of a semiconductor package using the package substrate of FIG. 6.

FIG. 7 is a cross-sectional view of a semiconductor package 200 using the package substrate 210 of FIG. 6.

Referring to FIG. 7, the semiconductor package 200 may have the same structure as the semiconductor package 100, except for the surface structure of the package substrate 210. The repetitive description may be herein omitted.

The sinks 215 may increase a space for receiving the adhesive 130 to reduce the likelihood for overflow of the adhesive 130. Further, formation of the sinks 215 may incorporate the indented lower surface 112 of the package substrate 210, thereby reducing the likelihood for nonflow of the adhesive 130. Therefore, the surface structure of the package substrate 210 having the sinks 215 may efficiently control the flow of the adhesive 130.

Consequently, the need for strict control of processing conditions may be reduced and a process margin of a chip attachment process, e.g., success rate, may be improved.

Thus, a package substrate may be provided as a generally planar structure having a first side and a second side, the second side having a non-planar surface structure, e.g., one or more sinks, thereon to accommodate or receive therein a flow of adhesive when joining the second surface with a semiconductor.

Although example, non-limiting embodiments of the present invention have been described in detail hereinabove, it should be understood that many variations and/or modifications of the basic inventive concepts taught herein, which may appear to those skilled in the art, will still fall within the spirit and scope of the example embodiments of the present invention as defined in the appended claims. For example, the height of the sink may be increased. The sinks may extend to a portion of the insulating layer as well as the passivation layer. A combination of the example embodiments may be made. Although the example embodiments show a single layer of lead patterns, a multilayered wiring substrate having multilayered lead patterns may be used. Orientation of the sinks has been described alternately as parallel to the short side and to the long side of the substrate, however, the present invention need not be limited to a particular such relative orientations. Further, the molding compound may be formed on the back surface and side surface of the semiconductor chip as well as in the window.

What is claimed is:

1. A semiconductor package including:
    a package substrate having an upper surface, and a lower surface, the package substrate including:
        a passivation layer formed on the lower surface of the package substrate,
        a window formed in a substantially central portion of the package substrate and extending through the package substrate, and
        at least one sink provided in the lower surface, the at least one sink formed into the passivation layer;
    a semiconductor chip having an active surface facing the lower surface of the package substrate, the active surface having a plurality of bond pads formed at a substantially central portion of the semiconductor chip to be aligned with the window, wherein the semiconductor chip is disposed on the lower surface of the package substrate to cover a portion of sink and a portion of the passivation layer adjacent to the sink; and
    an adhesive provided between the package substrate and the semiconductor chip, wherein the adhesive is provided on the passivation layer and extends into the at least one sink.

2. The package of claim 1, further including:
    conductive wires to connect the bond pads of the semiconductor chip to a set of lead patterns formed on the upper surface of the package substrate, the conductive wires passing through the window in the package substrate; and
    a molding compound provided in the window to protect the bond pads and the set of lead patterns and to affix the conductive wires.

3. The package according to claim 1, wherein the at least one sink comprises a pair of sinks arranged on opposing sides of the window to prevent the adhesive from contacting the plurality of bond pads.

4. The package of claim 3, wherein the pair of sinks are contiguous to the window.

5. The package of claim 3, wherein the pair of sinks are spaced from the window.

6. The package of claim 3, wherein the length of the pair of sinks is substantially similar to that of a longer side of the lower surface.

* * * * *

UNITED STATES PATENT AND TRADEMARK OFFICE
CERTIFICATE OF CORRECTION

PATENT NO. : 7,498,679 B2  Page 1 of 1
APPLICATION NO. : 11/354469
DATED : March 3, 2009
INVENTOR(S) : Jung-Seok Ryu et al.

It is certified that error appears in the above-identified patent and that said Letters Patent is hereby corrected as shown below:

Column 6, line 22, the word "surface," should read -- surface --;
Column 6, line 37, the word "sink" should read -- the sink --.

Signed and Sealed this

Twenty-fourth Day of November, 2009

David J. Kappos
*Director of the United States Patent and Trademark Office*